(12) United States Patent
Fortin

(10) Patent No.: US 6,503,824 B1
(45) Date of Patent: Jan. 7, 2003

(54) FORMING CONDUCTIVE LAYERS ON INSULATORS BY PHYSICAL VAPOR DEPOSITION

(75) Inventor: Vincent Fortin, Santa Clara, CA (US)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 09/976,392

(22) Filed: Oct. 12, 2001

(51) Int. Cl.⁷ ............................................ H01L 21/4763
(52) U.S. Cl. ...................... 438/622; 438/675; 438/676; 438/680
(58) Field of Search ................. 438/622, 675, 438/676, 680

(56) References Cited

U.S. PATENT DOCUMENTS

| | | | |
|---|---|---|---|
| 5,654,235 A | 8/1997 | Matsumoto et al. | 438/643 |
| 5,976,327 A | 11/1999 | Tanaka | 204/192.15 |
| 6,007,405 A | 12/1999 | Mei | 451/5 |
| 6,012,970 A | 1/2000 | Nagabushnam et al. | 451/41 |
| 6,071,572 A | 6/2000 | Mosely et al. | 427/570 |
| 6,107,192 A | 8/2000 | Subrahmanyan et al. | 438/637 |
| 6,121,134 A | 9/2000 | Burton et al. | 438/652 |
| 6,143,140 A | 11/2000 | Wang et al. | 204/192.12 |
| 6,156,647 A | 12/2000 | Hogan | 438/653 |
| 6,176,981 B1 | 1/2001 | Hong et al. | 204/192.15 |
| 6,264,812 B1 | 7/2001 | Raaijmakers et al. | 204/298.06 |
| 6,344,419 B1 * | 2/2002 | Forster et al. | 438/758 |
| 2001/0005056 A1 * | 6/2001 | Cohen | 257/751 |
| 2002/0023837 A1 * | 2/2002 | Stimson | 204/298.18 |

OTHER PUBLICATIONS

Chin, Barry L. et al., "Barrier and Seed Technologies for Sub–0–10 μm Copper Chips" May 2001, Cahners Semiconductor International, pp. 1–7.

"Handbook of Semiconductor Manufacturing Technology" (edited by Yoshio Nishi et al., 2000), pp. 409–410.

\* cited by examiner

*Primary Examiner*—John F. Niebling
*Assistant Examiner*—Lynne A. Gurley
(74) *Attorney, Agent, or Firm*—Skjerven Morrill LLP; Michael Shenker; James E. Parsons

(57) ABSTRACT

Conductive material is deposited by ionized physical vapor deposition on an insulator, possibly to contact a conductive layer exposed by an opening in the insulator. At the beginning of the deposition, the wafer bias is low (possibly zero), to prevent the insulator re-sputtering by the ionized conductive material as this material is being deposited. The contact resistance is improved (reduced) as a result.

13 Claims, 1 Drawing Sheet

FORMING CONDUCTIVE LAYERS ON INSULATORS BY PHYSICAL VAPOR DEPOSITION

BACKGROUND OF THE INVENTION

The present invention relates to forming conductive layers on insulators by physical vapor deposition (PVD).

FIG. 1 illustrates a conventional physical vapor deposition chamber 110 used to deposit conductive layers on a semiconductor wafer 120 in the process of fabrication of integrated circuits. The wafer is placed on a pedestal 130 at the bottom of the chamber. A target 140 is mounted at the top of the chamber and biased by a DC bias source 150. Argon or some other plasma forming gas is flown into chamber 110 and is ionized by an electrical field that can be created by the potential difference between wafer 120 and target 140, or by a separate coil 160. Due to the target bias created by source 150, the argon ions accelerate towards target 140 and dislodge molecules from the target. These sputtered molecules settle on wafer 120. (In a "reactive" physical vapor deposition, the sputtered molecules can undergo a chemical reaction before settling on the wafer; for example titanium molecules may react with nitrogen to form titanium nitride which is then deposited on the wafer.)

Some of the sputtered molecules settle on the walls of the chamber and not on the wafer. To increase the number of the molecules settling on the wafer, the molecules are ionized, and the wafer is biased to attract the ionized molecules (these ions are shown at 140$i$). In particular, in FIG. 1, coil 160 densifies the argon plasma in chamber 110, and this high density plasma causes at least some of the sputtered molecules to become ionized. (The plasma can eventually be sustained by ions 140$i$; the argon flow into the chamber can be turned off.) The wafer is biased by an AC or DC bias source 170 to attract the ions 140$i$. The bias from source 170 can be applied to the wafer or, alternatively, to pedestal 130 whose top surface can be made from an insulating material. This technique (ionizing the molecules sputtered from the target) is known as ionized physical vapor deposition (I-PVD) or ionized metal plasma deposition (IMP). An example IMP chamber 110 is a magnetron sputtering chamber of type Vectra available from Applied Materials of Santa Clara, Calif. as part of a system of type ENDURA®. The Vectra chamber is operated with bias source 170 providing an RF bias (13.56 MHz) applied to pedestal 130 having an insulating top surface, with bias source 150 providing a DC bias, and with coil 160 carrying an RF current (13.56 MHz).

Ionized PVD has particular advantages for contact fabrication. FIG. 2 illustrates a typical contact structure that can be fabricated in wafer 120. Conductive layer 210 is part of a semiconductor substrate (e.g. monocrystalline silicon), or is formed over a semiconductor substrate. Insulator 220 (e.g. silicon dioxide) is formed over layer 210. Contact opening 224 in insulator 220 exposes the layer 210. A conductive layer 230 is deposited by I-PVD over insulator 220 and into opening 224. Layer 230 can provide an interconnect contacting the layer 210 through opening 224. Layer 230 can also provide as an adhesion or barrier layer separating an overlying conductive layer (not shown) from layer 210. For example, layer 230 can be a titanium or titanium nitride layer separating an overlying aluminum or tungsten layer from silicon or metal layer 210.

Ionized PVD is a good method for fabrication of layer 230 because the wafer bias causes the ions 140$i$ to travel in a direction normal to the wafer. Deposition into deep openings 224 is therefore facilitated. Also, good sidewall coverage is achieved in the opening due to re-sputtering of layer 230. More particularly, as illustrated in FIG. 2, ions 140$i$ may dislodge previously deposited molecules 230a from layer 230. Some of the dislodged molecules 230$a$ settle on the sidewalls and the bottom of opening 224, improving the sidewall and bottom coverage. In addition, for some materials 230, a significant portion of the dislodged molecules 230$a$ comes from the top edges 224E of opening 224. Consequently, it is more difficult for the deposited material to form overhangs at the top edges of the opening, and hence deposition into the opening is further facilitated. See "Handbook of Semiconductor Manufacturing Technology" (edited by Yoshio Nishi et al., 2000), pages 409–410, incorporated herein by reference.

SUMMARY

The inventor has observed that at the beginning of the deposition, when insulator 220 is exposed, ions 140$i$ can dislodge the insulator molecules, and the insulator molecules can settle on layer 210. This undesirably increases the contact resistance.

According to one embodiment of the present invention, the wafer bias at the beginning of the deposition is set to zero. After some period (a few seconds in some embodiments), the wafer bias is increased. At this time, insulator 220 has been at least partially covered by material 230, so dislodging of the insulator molecules is unlikely.

In some embodiments, the wafer bias at the beginning of the deposition is not zero but is lower than at a later stage of the deposition.

Another technique that may reduce the possibility of the "insulator re-sputtering" (dislodging of the insulator molecules) is reducing the power in coil 160 at the beginning of the deposition, or reducing the target bias generated by source 150. Other embodiments are within the scope of the invention, as defined by the appended claims.

DESCRIPTION OF PREFERRED EMBODIMENTS

Figure 1:
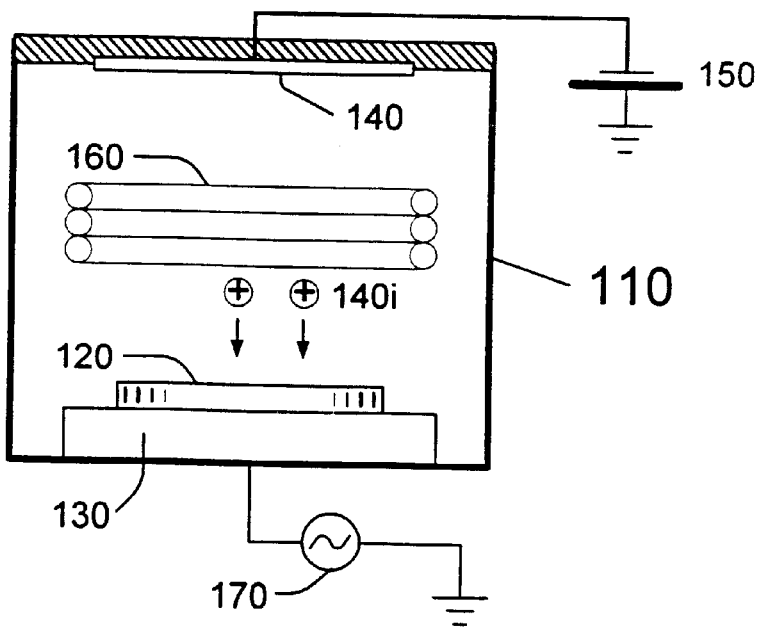
FIG. 1 is a side cross sectional view of an ionized PVD chamber.
Figure 2:
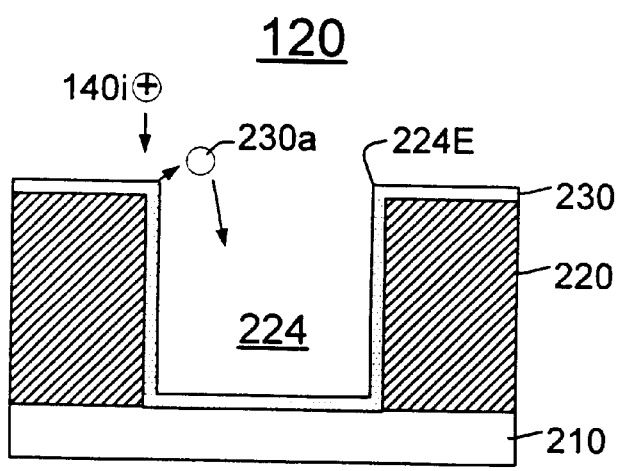
FIG. 2 is a cross sectional view of a semiconductor structure in the process of ionized PVD.

In one embodiment, titanium is deposited by I-PVD as layer 230 (FIG. 2) to a total thickness of about 10–15 nm. The deposition is performed in a system of type ENDURA, in an IMP chamber of type Vectra described above. Argon is used as a plasma forming gas. Layer 210 is a region of a monocrystalline silicon substrate. Insulator 220 is silicon dioxide 900 nm thick. Opening 224 has a width of 0.18 $\mu$m; the aspect ratio is thus 5:1. Titanium 230 is deposited in a two-step process. In the first step, the deposition parameters are:

DC power (source 150): 2 kW;

RF power (coil 160): 2500 W;

pressure in chamber 110: 33 mTorr;

wafer bias (source 170): 0 W;

deposition time: 6.7 seconds.

In the second step, the DC and RF power are the same, the pressure is 18 mTorr, the wafer bias is 150 W, and the deposition time is 4.5 seconds.

In some embodiments, the deposition is preceded by a pre-clean step to remove native oxide from layer 210. The pre-clean may be an RF pre-clean performed in-situ. "In-situ" means that the RF pre-clean is performed in the same cluster tool (e.g. ENDURA) as used for the deposition, and the vacuum is not broken between the pre-clean chamber and the deposition chamber. The RF pre-clean can be performed in argon plasma. The invention is not limited to any particular pre-clean technique, or to an in-situ pre-clean.

In some embodiments, the invention is used to form tungsten plug structures. The titanium deposition on insulator 220 (10–15 nm of titanium) is followed by an I-PVD deposition of a barrier layer of titanium nitride, possibly (but not necessarily) in the same deposition chamber 110 and without breaking the vacuum. The titanium nitride deposition can be realized by turning on a nitrogen flow into the chamber. The nitrogen will react with titanium and form titanium nitride. Then tungsten can be deposited by chemical vapor deposition, in a separate chamber. See for example U.S. patent application attorney docket no. M-11759 US filed by V. Fortin et al. on the same date as 20 the present application, entitled "Determining an Endpoint in a Polishing Process", incorporated herein by reference. See also U.S. patent application Ser. No. 09/881,607 filed Jun. 13, 2001 by V. Fortin, entitled "Thin Titanium Nitride Layers Used in Conjunction with Tungsten", incorporated herein by reference.

It is believed that re-sputtering of oxide 220 can also be reduced by reducing the ionization rate of the molecules deposited on wafer 120 (the ionization rate is the percentage of ions 140i in all of the molecules sputtered from target 140). Reduced ionization rate may be achieved by reducing the power in coil 160, or possibly by reducing the target bias generated by source 150. A combination of these techniques with each other and with the wafer bias reduction can also be employed.

The invention is not limited to particular materials, layer thicknesses, or deposition parameters. Target 140 may be biased with an AC bias. The invention is applicable to ionized PVD of titanium nitride or other materials directly on insulator 220. Insulator 220 may be a material other than silicon dioxide. Layer 210 may be metal or some other conductive material formed over a monocrystalline silicon substrate or a nonsilicon semiconductor substrate. Opening 224 can be a groove such as used in single and dual damascene structures.

In some embodiments, dislodging of molecules from target 120 is performed by evaporation, or with a pulsed laser, or by some other means, known or to be invented.

Other embodiments and variations are within the scope of the invention, as defined by the appended claims.

What is claimed is:

1. A fabrication method comprising:
    performing a physical vapor deposition (PVD) of a conductive material or materials on an insulating material which forms at least a portion of a substrate;
    during at least part of the physical vapor deposition, ionizing at least some of the conductive material or materials before the conductive material or materials reach the insulating material, and applying a bias to the substrate or a support on which the substrate is mounted, wherein said bias and/or the ionization rate of the conductive material or materials are lower at a beginning stage of the deposition than at a later stage of the deposition.

2. The method of claim 1 wherein the bias is lower at the beginning stage of the deposition that at the later stage.

3. The method of claim 2 wherein the bias is 0 W at the beginning stage of the deposition.

4. The method of claim 2 wherein the bias is an AC bias.

5. The method of claim 1 wherein the physical vapor deposition comprises dislodging of molecules from a target by ions of a plasma forming gas.

6. The method of claim 1 wherein:
    the substrate comprises a semiconductor material;
    the insulating material has an opening therethrough, the opening exposing conductive material underlying the insulating material.

7. The method of claim 6 wherein the physical vapor deposition forms a conductive layer over the insulating material and in the opening, and the PVD is followed by a deposition of another conductive material into the opening.

8. The method of claim 6 wherein the physical vapor deposition comprises a deposition of titanium or a titanium compound.

9. A fabrication method comprising:
    performing a physical vapor deposition (PVD) of a conductive material on an insulating material which forms at least a portion of a semiconductor substrate; and
    during at least part of the physical vapor deposition, ionizing at least some of the conductive material before the conductive material reaches the insulating material, and applying a bias to the semiconductor substrate or a support on which the semiconductor substrate is mounted,
wherein said bias is lower at a beginning stage of the deposition than at a later stage of the deposition.

10. The method of claim 9 wherein the bias is 0 W at the beginning stage of the deposition.

11. The method of claim 9 wherein the conductive material comprises titanium.

12. The method of claim 9 wherein the conductive material comprises tungsten.

13. The method of claim 9 wherein the conductive material comprises a metal.

* * * * *